United States Patent [19]

Merrem et al.

[11] Patent Number: 4,539,288

[45] Date of Patent: Sep. 3, 1985

[54] PROCESS FOR THE DEVELOPMENT OF RELIEF STRUCTURES BASED ON RADIATION-CROSSLINKED POLYMERIC PRECURSORS OF POLYMERS WHICH ARE RESISTANT TO HIGH TEMPERATURE

[75] Inventors: Hans-Joachim Merrem, Seeheim; Karlheinz Neisius, Darmstadt; Rudolf Klug, Aschaffenburg; Hartmut Härtner, Mühltal, all of Fed. Rep. of Germany

[73] Assignee: Merck Patent Gesellschaft mit Beschrankter Haftung, Darmstadt, Fed. Rep. of Germany

[21] Appl. No.: 561,505

[22] Filed: Dec. 15, 1983

[30] Foreign Application Priority Data

Dec. 15, 1982 [DE] Fed. Rep. of Germany ....... 3246403

[51] Int. Cl.$^3$ .......................... G03C 1/70; G03C 5/16
[52] U.S. Cl. .................................... 430/325; 430/283; 430/287; 430/331; 430/330
[58] Field of Search ............... 430/283, 287, 331, 330, 430/325

[56] References Cited

U.S. PATENT DOCUMENTS

| | | | |
|---|---|---|---|
| 2,670,286 | 2/1954 | Minsk et al. | 430/287 |
| 3,376,139 | 4/1968 | Giangualano et al. | 430/286 |
| 3,957,512 | 5/1976 | Kleeberg et al. | 430/283 |
| 4,045,223 | 8/1977 | Rubner et al. | 430/330 |
| 4,243,743 | 1/1981 | Hiramoto et al. | 430/330 |
| 4,321,319 | 3/1982 | Shoji et al. | 430/283 |
| 4,339,521 | 7/1982 | Ahne et al. | 430/330 |

OTHER PUBLICATIONS

Vaclav Sedivec and Jan Flek, *Handbook of Analysis of Organic Solvents*, (John Wiley & Sons, Inc., New York, N.Y., 1976) pp. 274-276.

*Primary Examiner*—John Kittle
*Assistant Examiner*—Cynthia Hamilton
*Attorney, Agent, or Firm*—Millen & White

[57] ABSTRACT

An improved development process for relief structures based on radiation-crosslinked polymeric precursors of polymers which are resistant to high temperature in which the development fluid used is an aliphatic or cycloaliphatic ketone having 3 to 7 carbon atoms, is distinguished by rapid and complete removal of soluble polymeric material from the substrate with, at the same time, a minimum amount of attack on the radiation-crosslinked polymeric structures.

12 Claims, No Drawings

PROCESS FOR THE DEVELOPMENT OF RELIEF STRUCTURES BASED ON RADIATION-CROSSLINKED POLYMERIC PRECURSORS OF POLYMERS WHICH ARE RESISTANT TO HIGH TEMPERATURE

BACKGROUND OF THE INVENTION

The invention relates to an improved development process for forming relief structures based on radiation-crosslinked polymeric precursors of polymers which are resistant to high temperature and which are based on radiation-sensitive photoresists.

Photoresists for forming relief structures from polymers which are resistant to high temperature are used widely in the production of electrical and electronic components of etch resists and plating resists or of printing molds. One of the most accurate processes for structuring insulating materials and semiconducting and conducting materials in electrotechnology and electronics is the photo technique. This entails resist relief structures produced by the photo technique being copied on substrates by suitable processes, such as etching, vapour deposition and metallising non-electrically or electrically.

Moreover, resist relief structures can assume a permanent protective function, for example as an insulating material.

Processes for the production of relief structures of these types from polymers which are resistant to high temperature, and photoresists suitable for these purposes, and the photosensitive soluble polymeric precursors used for this are known, for example, from German Pat. No. 2,308,830, German Pat. No. 2,437,348, German Pat. No. 2,437,368 and German Pat. No. 2,437,422, and German Patent Application 3,227,584 and German Patent Application 3,233,912, corresponding to U.S. Pat. Nos. 3,957,512, Re. 30,186, 4,045,223, 4,008,489, and U.S. Patent Applications Ser. Nos. 516,399 and 531,781, respectively. The entire disclosures of these references are incorporated herein by reference.

As a rule, photoresists of the type described contain radiation-sensitive soluble polymeric precursors. They are applied to a substrate in the form of a layer or film, the layer or film is dried and then irradiated through a negative mask. This leads to crosslinking taking place on the irradiated areas and this drastically reduces the solubility of the material applied there. The nonirradiated parts of the layer or film are then removed by dissolving or detaching using a developer; the remaining relief structures can then be converted by heat treatment into polymers which are resistant to high temperature and which survive temperatures of 250°–400° C. without adverse effects on the edge sharpness and resolution.

The soluble polymeric precursors used are polyaddition or polycondensation products of polyfunctional carbocyclic or heterocyclic compounds having radiation-sensitive radicals with diamines, diisocyanates, bis(acid chlorides) or dicarboxylic acids as are described in the patents referred to above.

Particularly preferred soluble polymeric precursors are polycondensates of pyromellitic acid, which has two radicals which react to radiation and are bonded in the manner of esters to carboxyl groups, and a diamine which contains at least one cyclic structural element, such as, for example, 4,4'-diaminodiphenyl ether, 4,4'-diaminodiphenylmethane, 4,4'-diaminodiphenyl sulfone or 2,4-diaminopyridine.

As a rule, soluble polymeric precursors of this type which are used in photoresists have molecular weights between 2,000 and 100,000, preferably between 4,000 and 60,000.

These soluble polymeric precursors are processed in a manner known per se to give the corresponding photoresists which, apart from a suitable solvent or mixture of solvents, can, where appropriate, contain additives which are known and customary in this technology, such as photosensitisers, photoinitiators, copolymerisable monomers or resins which react to radiation, adhesion promoters, plasticisers and pigments, dyestuffs and fillers.

The photoresists can be applied to the clean surface of the substrates at the layer thickness advantageous in the individual case by spraying, flow coating, rolling, spin coating and dip coating, the solvent then being removed by evaporation so that a radiation-sensitive layer remains on the surface of the substrate. The removal of the solvent can, where appropriate, be accelerated by heating the layer to temperatures up to 100° C. Subsequently, the layer of photoresist is exposed to radiation which causes the groups which react to radiation to react so as to crosslink in the layer. The irradiation or illumination can be carried out through a mask, but it is also possible to guide a collimated beam over the surface of the radiation-sensitive layer. UV lamps are normally used for the irradiation, these emitting radiation of a wavelength of 200 to 500 nm and an intensity of 0.5 to 60 mW/cm$^2$. An image pattern is now developed in the layer with exposure of parts of the substrate by treating the layer with a developer solution which removes the nonirradiated areas of the photoresist material. The resist images are obtained after customary washing and drying.

Now, the process step of development has particular importance in the production of radiatin-crosslinked photoresist structures since it exerts a considerable influence on the resolution and edge sharpness of the remaining resist structures as well as on their adhesion to the substrate and their material properties.

A good developer should remove the non-irradiated, soluble polymeric layers from the substrate in a short time which is suitable for practice. At the same time, the partial dissolution and erosion of the crosslinked resist layers, and the loss of thickness of the layer caused by this, should be kept to the minimum possible. In addition, constituents of the developer should penetrate into the crosslinked polymeric layers as little as possible since this is associated with swelling of the crosslinked resist layer and a decrease in its adhesion to the substrate. Furthermore, there is a requirement for a development process which is suitable for practice, that is to say the safety margin in the development time should be as wide as possible in that, while the erosion of crosslinked polymeric material is still within tolerable limits, the complete removal of non-crosslinked resist is ensured.

According to the state of the art, the developer solutions used are mixtures which consist of one or more solvents customary for the production of the photoresist and of a precipitant normally used in the production of the polymeric precursor of the photoresist. Examples of known and typical developer solutions are 4-butyrolactone/toluene, dimethylformamide/ethanol, dimethylformamide/methanol, methyl ethyl ketone/e- thanol and methyl i-butyl ketone/i-propanol, each in the ratio 2:1 to 4:1, each of the substances mentioned first being solvents and each of those mentioned second being precipitants. After development it is customary to rinse with the precipitant, and this merely serves to remove the developer completely.

The disadvantages of developer solutions of these types according to the state of the art are that they always attack, to a greater or lesser extent, the crosslinked polymeric layers, and this is manifested by erosion of the layer, swelling of the layer and a diminution in its adhesion to the substrate, and by the safety margin in the development time being too narrow. Hitherto, in order to decrease the extent of attack, a precipitant has always been added to the developer fluid in addition to the solvent.

OBJECTS OF THE INVENTION

One object of the invention is to provide an improved process for the development of relief structures based on radiation-crosslinked polymeric precursors of polymers which are resistant to high temperature, which process fulfills the requirements mentioned and does not have the above-mentioned disadvantages of the developers according to the state of the art.

Upon further study of the specification and appended claims, further objects and advantages of this invention will become apparent to those skilled in the art.

SUMMARY OF THE INVENTION

These objects can be achieved in a process for forming relief structures of highly heat-resistant polymers, comprising the steps of applying a photoresist comprising a soluble prepolymer being a poly-addition or polycondensation prepolymer containing radiation-reactive radicals, said photoresist being applied in the form of a layer or sheet to a substrate, drying the layer or sheet, irradiating the dried, radiation-sensitive layer or sheet through a negative original or using a guided collimated beam, dissolving out the non-irradiated portions of the layer or sheet using a developer fluid, optionally rinsing the resultant developed relief structure with a rinsing fluid, and optionally heat-treating the relief structure, by the improvement wherein said developer fluid consists essentially of a $C_{3-7}$-aliphatic or $C_{3-7}$-cycloaliphatic ketone; whereby said non-irradiated portions are rapidly removed with minimal erosion and swelling of the crosslinked layer, and the safety margin in the development time can be significantly increased.

Further improvement is achieved by rinsing the developed relief structure with a rinsing fluid consisting essentially of a $C_{1-4}$-aliphatic alcohol.

DETAILED DISCUSSION

Suitable developer fluids according to the invention are straight-chain or branched aliphatic and cycloaliphatic or alkyl-substituted cycloaliphatic ketones having 3 to 7 carbon atoms, such as, for example, acetone, methyl ethyl ketone, methyl isopropyl ketone, methyl isobutyl ketone, methyl tertiary-butyl ketone, cyclopentanone, cyclohexanone, cycloheptanone, 2- or 3-methylcyclopentanone or ethylcyclopentanone, or 2-, 3- or 4-methylcyclohexanone.

Acetone, methyl ethyl ketone, cyclopentanone and cyclohexanone are preferred, and of these acetone and cyclopentanone are in turn particularly preferred.

Some of these ketones have in fact already been mentioned as solvents for photoresists. However, it could not have been predicted that exactly these compounds fulfil, without the addition of a precipitant, all the requirements made of a developer so well and are suitable in such an excellent manner as developers for relief structures based on radiation-crosslinked precursors, especially of polyimides which are resistant to high temperature.

The embodiment of the development process according to the invention is particularly advantageous when, after development, the residual developer fliud is removed with a rinsing fluid.

In principle, all precipitants miscible with the developer are suitable as rinsing fluids, and it will be understood that the development step according to the invention can be followed by rinsing with any conventional rinsing fluid. Straight-chain or branched aliphatic alcohols having 1 to 4 carbon atoms are preferred; ethanol, propanol and isopropanol are particularly suitable.

The development process according to the invention for radiation-crosslinked polyimide photoresist structures and the use according to the invention of the ketones mentioned makes it possible to remove from the substrate, rapidly and without residues, the non-irradiated soluble polymeric layers. The new process is particularly distinguished by a minimal attack on the crosslinked polymeric layers, contrary to the result achieved by prior art developers to which a precipitant is purposely added for the purpose of decreasing the amount of attack. In the process according to the invention, the erosion of the crosslinked polymeric layer is considerably reduced compared with prior art developers, swelling of the crosslinked layer and the associated diminution in its adhesion to the substrate is avoided. Surprisingly, the process according to the invention also makes it possible for the safety margin in the development time to be markedly widened with no adverse effect on the crosslinked polymeric layers.

Erosion of the radiation-crosslinked polymer layer is measured by the percentage loss in thickness of the layer, which is also related to the intensity and duration of irradiation. Use of a $C_{3-7}$-ketone developer according to the invention can reduce the loss in layer thickness especially at lower irradiation energies, thereby increasing the efficiency of the process. Lengthening of development times by factors of 3-5, for example, can be achieved using developer fluids according to the invention rather than prior art developers.

Furthermore, the much lower toxicity of the fluids used in the process according to the invention compared with the constituents of prior art developers diminishes any adverse effect on the health of the operators who come into contact with these substances.

The radiation-crosslinked insolube intermediates produced in the resist layer undergo cyclisation on heat treatment at 200° to 400° C., and at the same time polymers are formed which are resistant to high temperature and, depending upon the polymeric precursors used in the photoresist, belong to the classes of polyimides, polyamideimides or polyesterimides. The class of polyimides is preferred for the production of relief structures resistant to high temperature.

These polymers which are resistant to high temperature have excellent chemical, electrical and mechanical properties. Thus, for example, photoresists of the type described are suitable, to a particular extent, for the production of protective layers, for example in the production of semiconductor components, dielectric layers in multilayer integrated circuits, as the final passivating layer on electrical devices and as the orienting layer of liquid crystal display cells.

Without further elaboration, it is believed that one skilled in the art can, using the preceding description, utilize the present invention to its fullest extent. The following preferred specific embodiments are, therefore, to be construed as merely illustrative, and not limitative of the remainder of the disclosure in any way whatsoever. In the following examples, all temperatures are set forth uncorrected in degrees Celsius; unless otherwise indicated, all parts and percentages are by weight.

EXAMPLE 1

(a) A photoresist comprises 5 g of a polymeric polyimide precursor (obtained by reacting pyromellitic dianhydride with 2-hydroxyethyl methacrylate and then with thionyl chloride and 4,4'-diaminodiphenyl ether in accordance with German Pat. No. 2,437,348, (U.S. Pat. No. Re. 30,186)
0.25 g of N-phenylamaleimide
0.1 g of Michler's ketone
0.05 g of vinyltrimethoxyethoxysilane dissolved in 10.5 ml of N-methylpyrrolidone.

(b) The photoresist from (a) is spin coated onto substrate samples having an $SiO_2$ surface and these are dried by heating. The 1.0 μm thick layers which are obtained are then, under nitrogen in a contact process, illuminated through a pattern of lines with a 200 W Hg lamp having an intensity of 9–10 mw/$cm^2$. The energy of illumination is increased stepwise from 960 mj/$cm^2$ to 2,400 mj/$cm^2$.

(c) Then the non-illuminated parts of the photoresist are washed out by development with cyclopentanone and then rinsed with isopropanol. Images having sharp edges and a resolution of less than 3 μm are obtained. The loss in thickness of the layer of the illuminated parts of the photoresist due to the process described above depends on the energy of illumination and decreases with increasing energy of illumination as shown:

| Energy of illumination | Loss in thickness of the layer |
| --- | --- |
| 960 mJ/$cm^2$ | 70% |
| 1,250 " | 65% |
| 1,540 " | 60% |
| 1,830 " | 50% |
| 2,110 " | 45% |
| 2,400 " | 40% |

COMPARISON EXAMPLE A

Under the same conditions as in Example 1, but using 4-butyrolactone/toluene, 1:1 (developer according to the state of the art), the loss in thickness of the layer is 70% irrespective of the illumination energy.

EXAMPLE 2

(a) A photoresist comprises 5 g of a polymeric polyimide precursor (as in Example 1)
0.25 g of N-phenylmaleimide
0.1 g of Michler's ketone
0.05 g of vinyltrimethoxyethoxysilane
1 g of 2,4,6-trisallyloxy-1,3,5-triazine dissolved in 6.5 ml of dimethylformamide.

(b) The photoresist from (a) is spin coated as indicated in Example 1 and illuminated, the thickness of the layer being 7.3 μm.

(c) Then the non-illuminated parts of the photoresist are washed out by spray development with cyclopentanone and then rinsed with isopropanol. The loss in thickness of the layer and the resolution are not affected by increasing the development time from 10 to 50 seconds.

COMPARISON EXAMPLE B

Under the same conditions as in Example 2, but using 4-butyrolactone/toluene, 1:1, well resolved structures are only obtained with spray development times of 10 to 15 seconds.

The preceding examples can be repeated with similar success by substituting the generically or specifically described reactants and/or operating conditions of this invention for those used in the preceding examples.

From the foregoing description, one skilled in the art can easily ascertain the essential characteristics of this invention, and without departing from the spirit and scope thereof, can make various changes and modifications of the invention to adapt it to various usages and conditions.

What is claimed is:

1. In a process for forming relief structures convertible to heat-resistant polyimide polymers, comprising the steps of applying a photoresist comprising a soluble polyimide precursor containing radiation-reactive radicals, said photoresist being applied in the form of a layer or sheet to a substrate, drying the layer or sheet, irradiating the dried, radiation-sensitive layer or sheet through a negative original or using a guided collimated beam, dissolving out the non-irradiated portions of the layer or sheet using a developer fluid to develop a relief structure, the improvement wherein said developer fluid consists essentially of a $C_{3-7}$-aliphatic or $C_{3-7}$-cycloaliphatic ketone; whereby said non-irradiated portions are rapidly removed with minimal erosion and swelling of the crosslinked layer, and the safety margin in the development time can be significantly increased.

2. The process of claim 1, wherein said $C_{3-7}$-ketone is acetone, methyl ethyl ketone, methyl isopropyl ketone, methyl isobutyl ketone, methyl tertiary-butyl ketone, cyclopentanone, cyclohexanone, cycloheptanone, 2- or 3-methylcyclopentanone or ethylcyclopentanone, or 2-, 3- or 4-methylcyclohexanone.

3. The process of claim 2, wherein said ketone is acetone, methyl ethyl ketone, cyclopentanone or cyclohexanone.

4. The process of claim 3, wherein said ketone is acetone.

5. The process of claim 3, wherein said ketone is cyclopentanone.

6. The process of claim 1, wherein said process comprises said rinsing step, and wherein in said improvement, said rinsing fluid consists essentially of a $C_{1-4}$-aliphatic alcohol.

7. The process of claim 6, wherein said $C_{1-4}$-alcohol is ethanol, propanol or isopropanol.

8. The process of claim 7, wherein said $C_{3-7}$-ketone is acetone, methyl ethyl ketone, cyclopentanone or cyclohexanone.

9. The process of claim 8, wherein said ketone is acetone.

10. The process of claim 8, wherein said ketone is cyclopentanone.

11. The process of claim 1, wherein the relief structure is rinsed with a rinsing fluid.

12. The process of claim 1, wherein the relief structure is heat-treated.

* * * * *